(12) United States Patent
Jahnes et al.

(10) Patent No.: US 6,380,003 B1
(45) Date of Patent: Apr. 30, 2002

(54) DAMASCENE ANTI-FUSE WITH SLOT VIA

(75) Inventors: Christopher V. Jahnes, Upper Saddle River, NJ (US); Chandrasekhar Narayan, Hopewell Junction; Carl J. Radens, LaGrangeville, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/469,374

(22) Filed: Dec. 22, 1999

(51) Int. Cl.[7] .................... H01L 21/82; H01L 21/44; H01L 21/4763; H01L 29/00
(52) U.S. Cl. .................... 438/131; 438/130; 438/600; 438/622; 438/637; 438/638; 438/639; 438/640; 257/530
(58) Field of Search ................... 438/130–132, 438/600–601, 622, 129, 637–640; 257/530

(56) References Cited
U.S. PATENT DOCUMENTS

| 5,464,790 | A | | 11/1995 | Hawley | 438/600 |
|---|---|---|---|---|---|
| 5,565,703 | A | | 10/1996 | Chang | 257/53 |
| 5,578,836 | A | | 11/1996 | Husher et al. | 257/50 |
| 5,592,016 | A | | 1/1997 | Go et al. | 257/530 |
| 5,780,323 | A | | 7/1998 | Forouhi et al. | 438/131 |
| 5,789,764 | A | | 8/1998 | McCollum | 257/26 |
| 5,856,233 | A | | 1/1999 | Bryant et al. | 438/600 |
| 6,033,977 | A | * | 3/2000 | Gutsche et al. | 438/618 |
| 6,087,677 | A | * | 7/2000 | Wu | 257/50 |

* cited by examiner

*Primary Examiner*—Ha Tran Nguyen
(74) *Attorney, Agent, or Firm*—Scully, Scott, Murphy & Presser; Steven Capella

(57) ABSTRACT

Interconnect structures comprising a substrate having a first level of electrically conductive features formed thereon; a patterned interlevel dielectric material formed on said substrate, wherein said patterned interlevel dielectric includes via spaces, wherein at least one of said via spaces is a slot via in which an anti-fuse material is formed on a portion thereof; and a second level of electrically conductive features formed in said spaces, whereby the anti-fuse material in the slot via provides a connection between the first and second levels of electrically conductive features and a method of fabricating the same.

17 Claims, 3 Drawing Sheets

DAMASCENE ANTI-FUSE WITH SLOT VIA

FIELD OF THE INVENTION

The present invention relates to interconnect structures, and more particularly to interconnect structures such as anti-fuse structures in which an anti-fuse material is formed within a slot via to provide a connection between various conductive levels present in the interconnect structure.

BACKGROUND OF THE INVENTION

The manufacture of integrated circuits (ICs) typically includes the formation of metallization layers which are patterned to provide interconnection between devices. Some IC interconnections are programmable, either with fuses or anti-fuses. Unprogrammed fuses provide a low resistance link between or within metallization layers which can be programmed by being blown. That is, the fuse can be caused to be non-conductive by applying a sufficiently high current across it to blow.

Anti-fuses operate in the opposite fashion, i.e., the unprogrammed structure used to form the anti-fuse has an intrinsically high resistance, and the programmed structure has a relatively low resistance. By applying a programmable current of, for example, 1 mA, the electrical resistance through the anti-fuse material is greatly reduced providing a conductive link between or within metallization levels. Typical prior art anti-fuse materials include: amorphous silicon, amorphous carbon, carbon, germanium, selenium, compound semiconductors such as GaAs, SiC, AIP, InSb and CdTe, and ceramics such as $Al_2O_3$.

One prior art anti-fuse structure is shown in FIG. 1. Specifically, the structure shown in FIG. 1 comprises a substrate 12 such as a Si wafer. An oxide layer 14 overlays the substrate, and can be formed by a variety of well known deposition processes such as chemical vapor deposition. A metal layer 16 is then formed on the oxide layer utilizing conventional deposition processes such as evaporation or sputtering. A second oxide layer 18 is formed over the metal layer and a via 20 is formed in the second oxide layer utilizing conventional lithography and reactive-ion etching (RIE). One of the above mentioned anti-fuse materials is then formed in the via to form an anti-fuse structure 22. A second metal layer 24 is then formed over the structure.

Programming of the anti-fuse structure of FIG. 1 can be accomplished by providing a current of about 10 mA between the metal layers. Before programming, the anti-fuse structure typically has a resistance of above 1 giga-ohm for a 1 $\mu$m diameter via. A programmed anti-fuse forms a conductive path 26 between the metal layers having a resistance of about 20–100 ohms.

Anti-fuse structures allow for much higher programmable interconnection densities than standard fuse structures. A major problem with prior art anti-fuse structures is that dedicated lithographic masking levels are required to fabricate the same. Not only does the use of such dedicated lithographic masking levels add additional cost to the overall process, but it adds to the complexity of the same.

In view of the above mentioned problems with prior art anti-fuse structures, there is a continued need to develop a new and improved method in which an anti-fuse structure is fabricated without employing dedicated lithographic masking levels.

SUMMARY OF THE INVENTION

One object of the present invention is to provide a method of fabricating an interconnect structure in which an anti-fuse material is formed between various conductive levels of the structure without the need of employing dedicated lithographic masking levels.

Another object of the present invention is to provide a method in which the anti-fuse material is formed in a slot via that is present in an interlevel dielectric layer of an interconnect structure; the slot via consists of an enlarged contact via which provides increase in overlay tolerance with the next layer contact via.

A still further object of the present invention is to provide a method in which an anti-reflective coating is employed as the anti-fuse material.

These and other objects and advantages are achieved in the present invention by employing the following method which includes the steps of:

(a) providing a substrate having a first level of electrically conductive features formed therein;

(b) forming an interlevel dielectric material on said first level of electrically conductive features, said interlevel dielectric material having an upper surface;

(c) forming vias in said interlevel dielectric material to expose portions of said first level of electrically conductive features, wherein at least one of said vias is a slot via;

(d) applying a conformal anti-fuse material on said interlevel dielectric material;

(e) applying a photoresist on said anti-fuse material;

(f) patterning said photoresist, said patterned photoresist containing spaces corresponding to positions for a second level of electrically conductive features;

(g) etching said substrate, whereby portions of said anti-fuse material are removed from said spaces;

(h) stripping said photoresist;

(i) filling spaces in said interlevel dielectric material with a conductive material, whereby said second level of electrically conductive features is formed, said second level of electrically conductive features and said first level of electrically conductive features being connected by said anti-fuse material; and (j) removing portions of said anti-fuse material at the upper surface of said interlevel dielectric material, whereby portions of said anti-fuse material remain over a portion of said first level of said electrically conductive features in said slot via.

The above processing steps may be repeated any number of times providing a multilevel interconnect structure in which the anti-fuse material is formed in the slot vias of various interlevel dielectric layers.

In an optional embodiment of the present invention, a barrier layer is formed in the interlevel dielectric spaces prior to filling the spaces with a conductive material. This typically occurs between steps (h) and (i) above and is used when the first and second levels of electrically conductive features are wiring levels of an interconnect structure.

The present invention also provides interconnect structures in which the anti-fuse material is formed in a slot via so as to provide a connection between a first level of electrically conductive features and a second level of electrically conductive features. Specifically, the interconnect structure of the present invention comprises:

a substrate having a first level of electrically conductive features formed thereon;

a patterned interlevel dielectric material formed on said substrate, wherein said patterned interlevel dielectric includes via spaces, wherein at least one said via spaces is a slot via in which an anti-fuse material is formed on a portion thereof; and a second level of electrically conductive features formed in said spaces, whereby the anti-fuse material in the slot via provides a connection between the first and second levels of electrically conductive features.

DETAILED DESCRIPTION OF THE INVENTION

Figure 1:
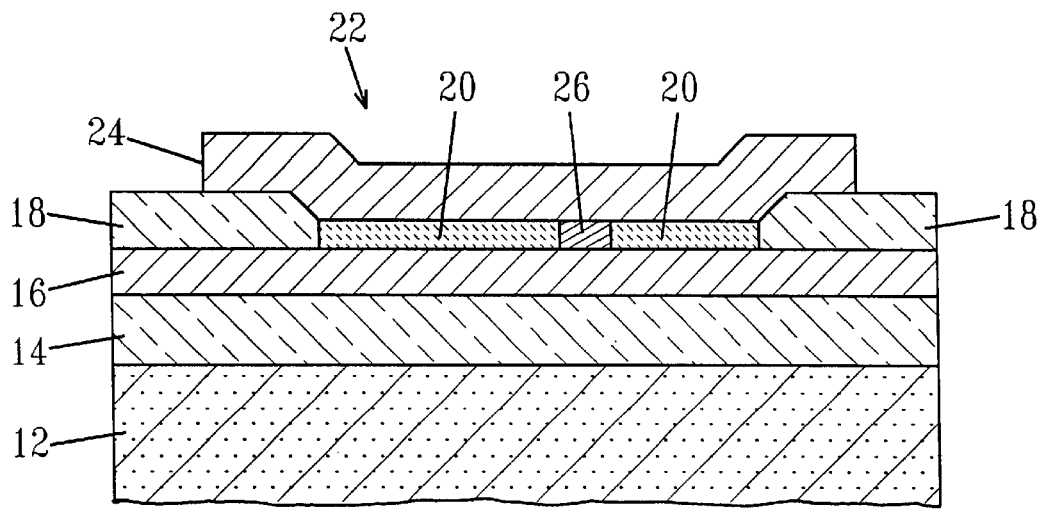
FIG. 1 is a cross-sectional view of a prior art anti-fuse structure.

The present invention which provides a method of fabricating interconnect structures containing an anti-fuse material in slot vias and interconnect structures containing the same will now be described in more detail by referring to the drawings that accompany the present application. It is noted that in the accompanying drawings like reference numerals are used for describing like and corresponding elements.

Reference is first made to FIGS. 2a–2g which illustrate the basic processing steps that are employed in the present invention. It is emphasized that the structure shown in the drawings of the present invention illustrates a basic interconnect structure that can be formed. Other structures in which a connection between two different conductive levels is required are also contemplated in the present invention. Illustrative examples of other structures in which the method of the present invention can be employed include, but are not limited to: first level conductive feature may be a patterned silicon substrate.

Referring back to FIGS. 2a–2g, and in particularly FIG. 2a, there is shown the initial structure of the present invention which includes a substrate 50 having a first level of electrically conductive features 52 formed thereon. Substrate 50 may be composed of a semiconducting material such as Si, Ge, SiGe, GaAs, InAs, InP and all other III/V semiconductor compounds, or it may be one of the interlevel dielectric layers of an interconnection structure. Layered substrates composed of the same or different semiconducting materials, e.g., Si/SiGe, are also contemplated herein. When the substrate is composed of one of the interlevel dielectric materials, it may be composed of any conventional inorganic or organic dielectric material. Suitable organic dielectrics include, but are not limited to: polyimides, polyamides, paralyene, polymethylmethacrylate and other like organic dielectrics. If an inorganic dielectric is employed, it may be composed of $SiO_2$, $Si_3N_4$, diamond, diamond-like carbon, fluorinated doped oxides and other like material.

The first level of electrically conductive features may be formed on the surface of the substrate utilizing conventional deposition processes such as chemical vapor deposition (CVD), plasma-assisted CVD, sputtering, plating, evaporation and like deposition processes and then the deposited metal layer may be patterned by conventional lithography and etching (reactive-ion etching (RIE)). Alternatively when the first level of electrically conductive features is formed in a portion of the substrate, a conventional single or dual damascene process may be employed.

Suitable materials used in forming the first level of electrically conductive features in the substrate include any conventional conductive metal including, but not limited to: aluminum (Al), tungsten (W), copper (Cu), chromium (Cr), gold (Au), platinum (Pt), palladium (Pd) and alloys, mixtures and complexes thereof.

Figure 2A:
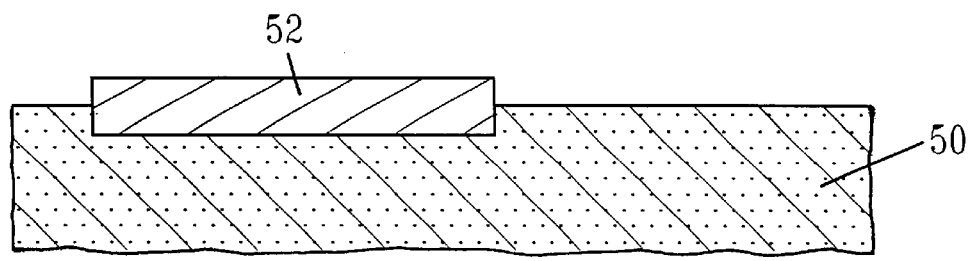
FIGS. 2a–2g are cross-sectional views depicting the various processing steps employed in the present invention.
Figure 2B:
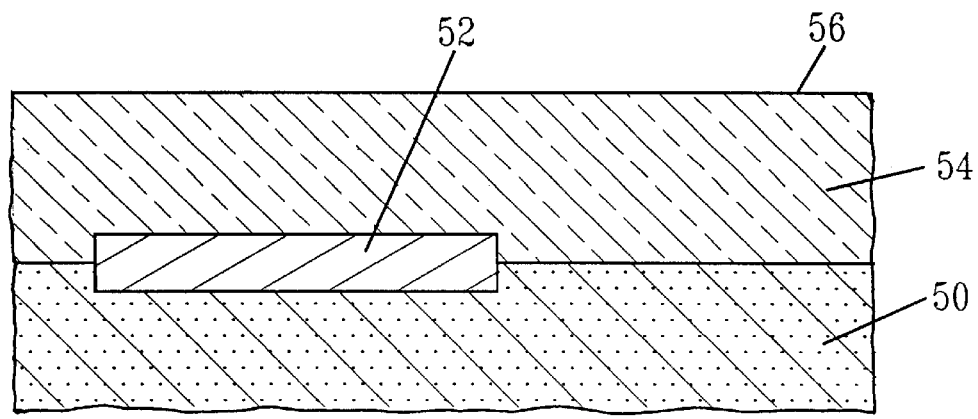

In accordance with the next step of the present invention, and as is shown in FIG. 2b, an interlevel dielectric material 54 having upper surface 56 is formed on the surface of substrate 50 and first level of electrically conductive features 52 utilizing conventional deposition processes well known to those skilled in the art. This includes CVD, plasma-assisted CVD, sputtering, plating, evaporation and like deposition processes. An optional planarization process such as chemical-mechanical polishing (CMP) or grinding may follow the deposition of the interlevel dielectric material.

Interlevel dielectric material 54 may be composed of the same or different dielectric material as may be present in the substrate. When like materials are employed, an optional barrier layer composed of, for example, TiN or Ta, may be formed between the two dielectric surfaces. The thickness of interlevel dielectric material layer 54 is not critical to the present invention, but typically the interlevel dielectric layer has a thickness of from about 0.1 to about 2.0 $\mu$m.

Figure 2C:
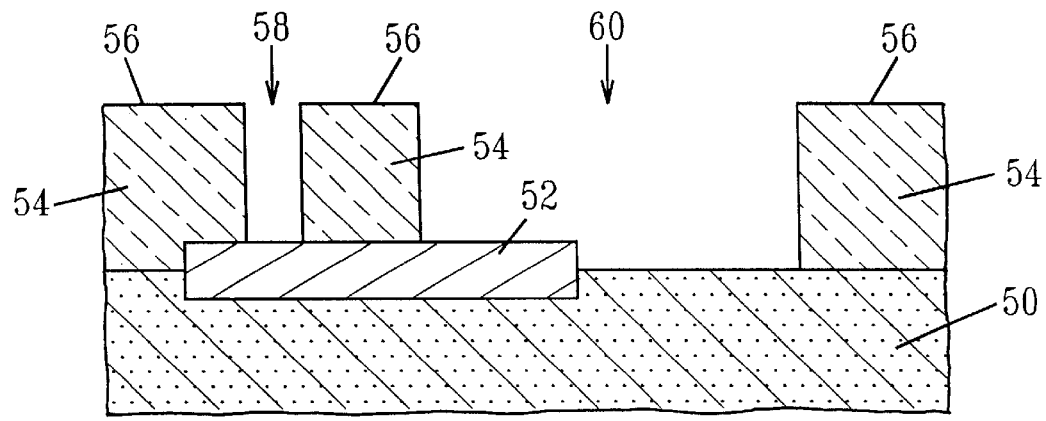

Following deposition of interlevel dielectric 54, at least one via 58 is formed in interlevel dielectric 54 to expose portions of the first level of electrically conductive features 52, wherein at least one of the vias is a slot via 60. The term "slot via" is used herein to denote an opening which has an elongated shape as compared to a via. The vias, on the other hand, are contact holes which have a much narrower opening as compared to the slot vias. The structure containing the via and slot via is shown in FIG. 2c.

The via and slot via are formed in the present invention utilizing conventional lithography and etching such as RIE. As known to one skilled in the art, the lithography process includes application of a photoresist, patterning the photoresist and developing the pattern.

Next, a conformal layer 62 of an anti-fuse material is formed on the structure containing the vias and slot vias. The application of the anti-fuse material covers all exposed surfaces of the structure shown in FIG. 2c, thus the anti-fuse material is formed over upper surface 56 of interlevel dielectric 54; on the side walls of vias 58 and slot vias 60, and on any exposed surface of first level of electrically conductive features 52 and substrate 50. The resultant structure containing the conformal layer of anti-fuse material formed thereon is shown in FIG. 2d.

The anti-fuse material is formed on the structure utilizing any conventional deposition process wherein a conformal coating can be obtained. Suitable deposition processes which are capable of forming a conformal coating include, but are not limited to: CVD, plasma-assisted CVD, sputtering, evaporation and other like deposition processes. The thickness of the anti-fuse material is not critical to the present invention, nevertheless, a typical thickness range for the anti-fuse material is from about 2 to about 200 nm, with a range from about 5 to about 10 nm being preferred.

The term "anti-fuse material" is used herein to denote any thin film dielectric which can function, not only in the capacity mentioned in the background section of this application, i.e., as an anti-fuse, but also to provide a connection between various metal layers of an interconnect structure. Suitable anti-fuse materials that can be employed in the present invention include, but are not limited to: $SiO_2$, $Si_3N_4$, Si oxynitrides, amorphous Si, amorphous C, H-containing dielectrics, carbon, germanium, selenium, compound semiconductors such as GaAs, SiC, AlP, InSb and CdTe, ceramics and other like anti-fuse materials. The present invention also contemplates the use of anti-reflective coatings such as silicon oxynitride as possible anti-fuse materials. Of these anti-fuse materials, silicon oxynitride is particularly preferred in the present invention.

Figure 2D:
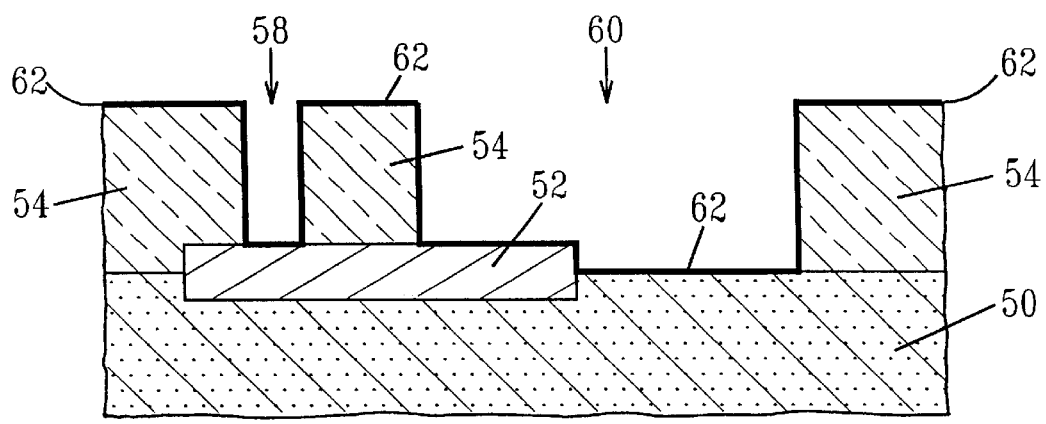
Figure 2E:
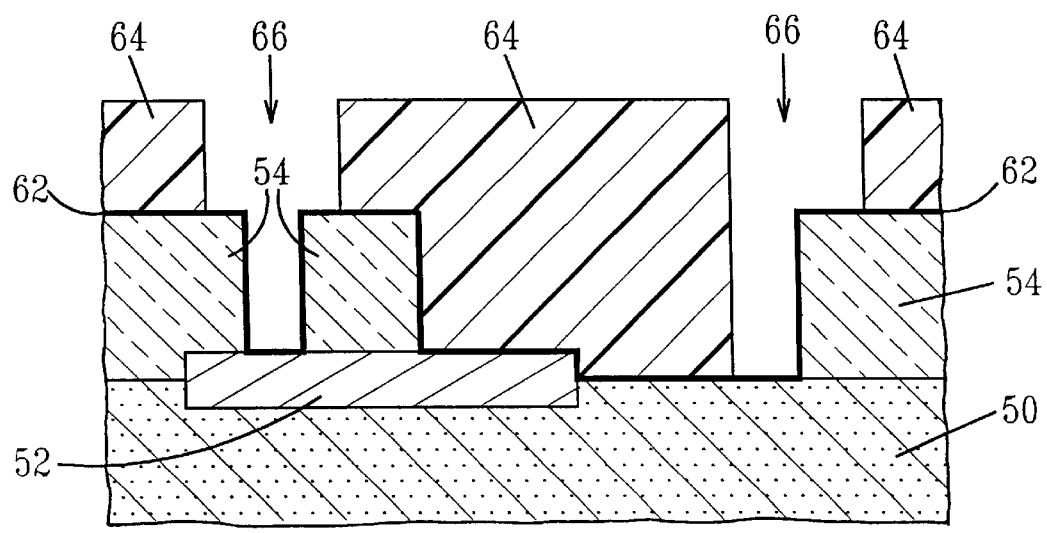

A conventional photoresist is applied to the structure shown in FIG. 2d using conventional processes and then the photoresist is patterned utilizing conventional lithography to provide a patterned photoresist 64 as is shown in FIG. 2e. Specifically, the patterned photoresist contains spaces 66 which correspond to positions in which the second level of electrically conductive features will subsequently be formed. It is noted that a portion of the patterned photoresist remains over at least a portion of the anti-fuse material that is formed over the first level of electrically conductive features in the slot via region provided above.

Figure 2F:
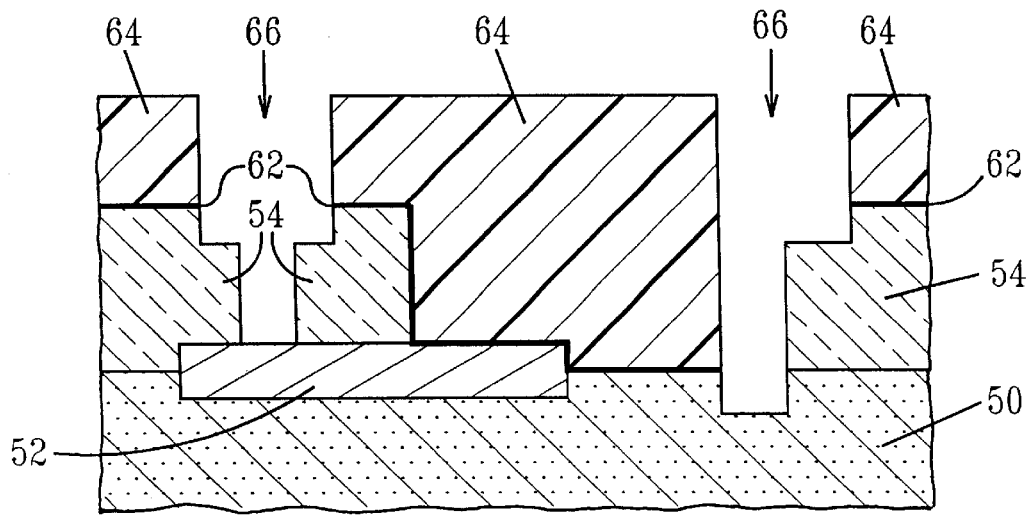
Figure 2G:
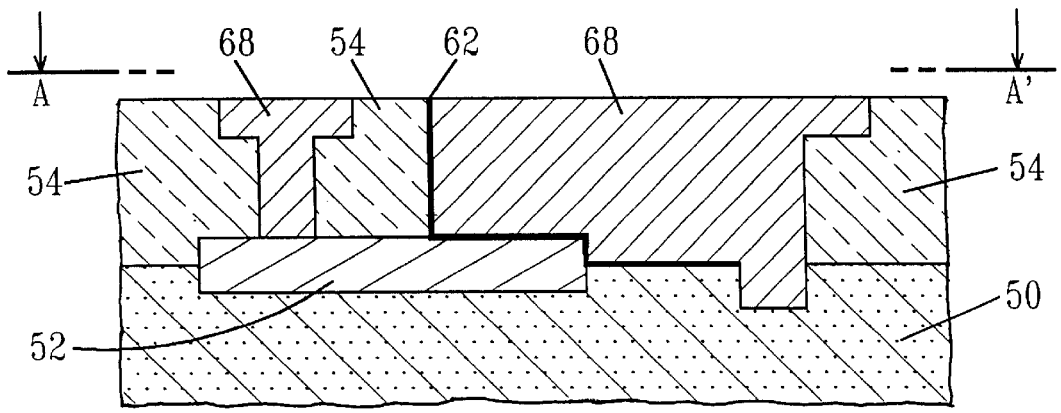

After patterning the photoresist, portions of exposed anti-fuse material, not containing the photoresist, are removed utilizing a conventional dry etching process such as RIE or plasma etching providing a structure as shown in FIG. 2f. It is noted that the etching process removes at least the anti-fuse material that is formed on the horizontally exposed surfaces of the via and slot via; anti-fuse material present on vertical sidewalls of the structure do not have to be removed. It is also noted that the etching step may optionally remove some portions of interlevel dielectric 54 and/or some portions of the substrate. In a preferred embodiment of the present invention, all the anti-fuse material formed in spaces 66 are removed by this step of the present invention.

The photoresist is then removed utilizing conventional stripping processes well known to those skilled in the art, and spaces 66 in interlevel dielectric 54 are filled with a suitable conductive material 68 utilizing conventional deposition processes such as CVD, plasma-assisted CVD, sputtering and other like processes. After filling the spaces with the conductive material, the structure may be optionally planarized utilizing conventional planarization techniques, i.e., CMP.

Figure 3:
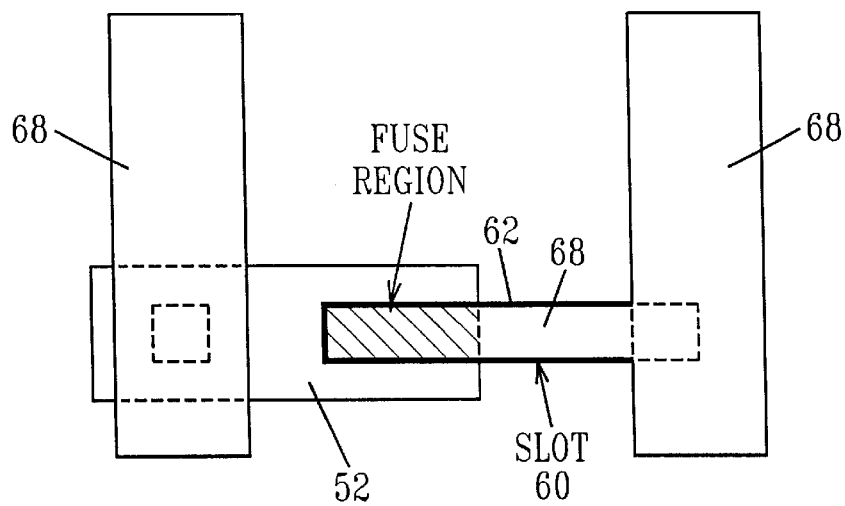
FIG. 3 is top view down A–A' of FIG. 2g.

The conductive material used to fill the spaces in the interlevel dielectric includes any of the previous mentioned conductive metals used in forming the first level of conductive metal features. It is noted that the filling step of the present invention forms the second level of conductive features in the structure, See FIG. 2g and FIG. 3, which is a top view of FIG. 2g. It is also noted that in the structure shown in FIG. 2g and FIG. 3, the anti-fuse material is present in the slot via of the structure and the anti-fuse material forms a connective path from the first level of conductive metal features to the second level of conductive features.

Optionally, a barrier layer comprising a conventional barrier material such as TiN or Ta is formed in the vias and slot vias utilizing conventional deposition processes that are well known to those skilled in the art, e.g. CVD, sputtering and evaporation. The optional embodiment is not shown in the figures of the present invention.

Next, portions of the anti-fuse material that were formed on upper surface 56 of interlevel dielectric 54 are removed utilizing a conventional etching process such as RIE. It should be noted that during this step of the present invention, the etching does not remove the anti-fuse material that is formed over the first level of conductive features in the slot via.

The above processing steps may be repeated any number of times to provide a multilevel interconnect structure which has the above mentioned features.

While the present invention has been particularly shown and described with respect to preferred embodiments thereof, it will be understood by those skilled in the art that the foregoing and other changes in form and detail may be made without departing from the spirit and scope of the present invention. It is therefore intended that the present invention not be limited to the exact forms and details described and illustrated, but fall within the spirit and scope of the appended claims.

What is claimed is:

1. A method of forming an interconnect structure wherein various levels containing conductive metal features are connected by an anti-fuse material, said method comprising the sequential steps of:
   (a) providing a substrate having a first level of electrically conductive features formed thereon;
   (b) forming an interlevel dielectric material on said first level of electrically conductive features, said interlevel dielectric material having an upper surface;
   (c) forming vias in said interlevel dielectric material to expose portions of said first level of electrically conductive features, at least one of said vias is a slot via;
   (d) applying a conformal anti-fuse material to said interlevel dielectric material and said exposed portions of said first level of electrically conductive features;
   (e) applying a photoresist on said anti-fuse material;
   (f) patterning said photoresist, said patterned photoresist containing spaces defining to positions for a second level of electrically conductive features;
   (g) etching at least exposed horizontal surfaces of said anti-fuse material present in said vias including said at least one slot via such that portions of said anti-fuse material are removed from said spaces including said spaces in said at least one slot via;
   (h) stripping said photoresist;
   (i) filling spaces in said interlevel dielectric material with a conductive material, whereby said second level of electrically conductive features is formed, said second level of electrically conductive features and said first level of electrically conductive metal features being connected by said anti-fuse material; and
   (j) removing said anti-fuse material at the upper surface of said interlevel dielectric material, whereby said anti-fuse material remain only in said at least one slot via and over a portion of said first level of said electrically conductive features in said at least one slot via.

2. The method of claim 1 wherein step (a) includes a single or dual damascene process.

3. The method of claim 1 wherein step (b) includes a deposition process and, optionally, a planarization process.

4. The method of claim 3 wherein said deposition process is selected from the group consisting of chemical vapor deposition (CVD), plasma-assisted CVD, sputtering and evaporation.

5. The method of claim 3 wherein said optional planarization process includes chemical-mechanical polishing (CMP) or grinding.

6. The method of claim 1 wherein said interlevel dielectric has a thickness of from about 0.1 about 2.0 $\mu$m.

7. The method of claim 1 wherein step (c) includes lithography and etching.

8. The method of claim 1 wherein step (d) includes a deposition process selected from the group consisting of CVD, plasma-assisted CVD, sputtering and evaporation.

9. The method of claim 1 wherein said anti-fuse material has a thickness of from about 2 to about 200 nm.

10. The method of claim 9 wherein said anti-fuse material has a thickness of from about 5 to about 10 nm.

11. The method of claim 1 wherein said anti-fuse material is a material selected from the group consisting of $SiO_2$, $Si_3N_4$, Si oxynitrides, amorphous Si, amorphous C, H-containing dielectrics, carbon, germanium, selenium, compound semiconductors, ceramics and anti-reflective coatings.

12. The method of claim 11 wherein said anti-reflective coating is a silicon oxynitride.

13. The method of claim 1 wherein said anti-fuse material is silicon oxynitride.

14. The method of claim 1 wherein step (g) includes reactive-ion etching or plasma-etching.

15. The method of claim 1 wherein step (i) includes a deposition process and, optionally, a planarization process.

16. The method of claim 15 wherein said deposition process is selected from the group consisting of chemical vapor deposition (CVD), plasma-assisted CVD, sputtering, plating and evaporation.

17. The method of claim 1 wherein between steps (h) and (i) a barrier layer is applied in said vias and said at least one slot via.

* * * * *